(12) United States Patent
McCormack

(10) Patent No.: US 8,939,773 B2
(45) Date of Patent: Jan. 27, 2015

(54) CONNECTORS PROVIDING HAPTIC FEEDBACK

(71) Applicant: Keyssa, Inc., Mountain View, CA (US)

(72) Inventor: Gary D. McCormack, Tigard, OR (US)

(73) Assignee: Keyssa, Inc., Mountain View, CA (US)

( * ) Notice: Subject to any disclaimer, the term of this patent is extended or adjusted under 35 U.S.C. 154(b) by 0 days.

(21) Appl. No.: 14/451,427

(22) Filed: Aug. 4, 2014

(65) Prior Publication Data

US 2014/0342579 A1 Nov. 20, 2014

Related U.S. Application Data

(63) Continuation of application No. 13/713,564, filed on Dec. 13, 2012, now Pat. No. 8,794,980.

(60) Provisional application No. 61/570,707, filed on Dec. 14, 2011.

(51) Int. Cl.
*H01R 11/30* (2006.01)
*H01R 13/62* (2006.01)

(52) U.S. Cl.
CPC .................................. *H01R 13/6205* (2013.01)
USPC ........................................................... 439/39

(58) Field of Classification Search
CPC .... H01R 13/6205; H01R 11/30; H01R 13/64; H01R 31/06; H01R 13/2421
USPC ................................ 439/38–40, 217–218, 700
See application file for complete search history.

(56) References Cited

U.S. PATENT DOCUMENTS

| 5,921,783 | A | * | 7/1999 | Fritsch et al. | 439/38 |
| 5,941,729 | A | * | 8/1999 | Sri-Jayantha | 439/505 |
| 2006/0051981 | A1 | * | 3/2006 | Neidlein et al. | 439/39 |
| 2012/0083137 | A1 | * | 4/2012 | Rohrbach et al. | 439/39 |

* cited by examiner

*Primary Examiner* — Edwin A. Leon
(74) *Attorney, Agent, or Firm* — Fenwick & West LLP

(57) ABSTRACT

A first connector may include a housing defining a first connector face to be positioned in a first position or a second position proximate to a second connector face of a second connector. A first extremely high frequency (EHF) communication unit may be disposed in the housing for communicating with a second EHF communication unit of the second connector when the first connector face is positioned in first or second position relative to the second connector face. A first magnet may be disposed in the housing. The first magnet may align with and repel a second magnet disposed relative to the second connector face when the first connector face is positioned in the second position. The first magnet may be configured not to align with and not to repel the second magnet when first connector face is positioned in the first position relative to the second connector face.

11 Claims, 11 Drawing Sheets

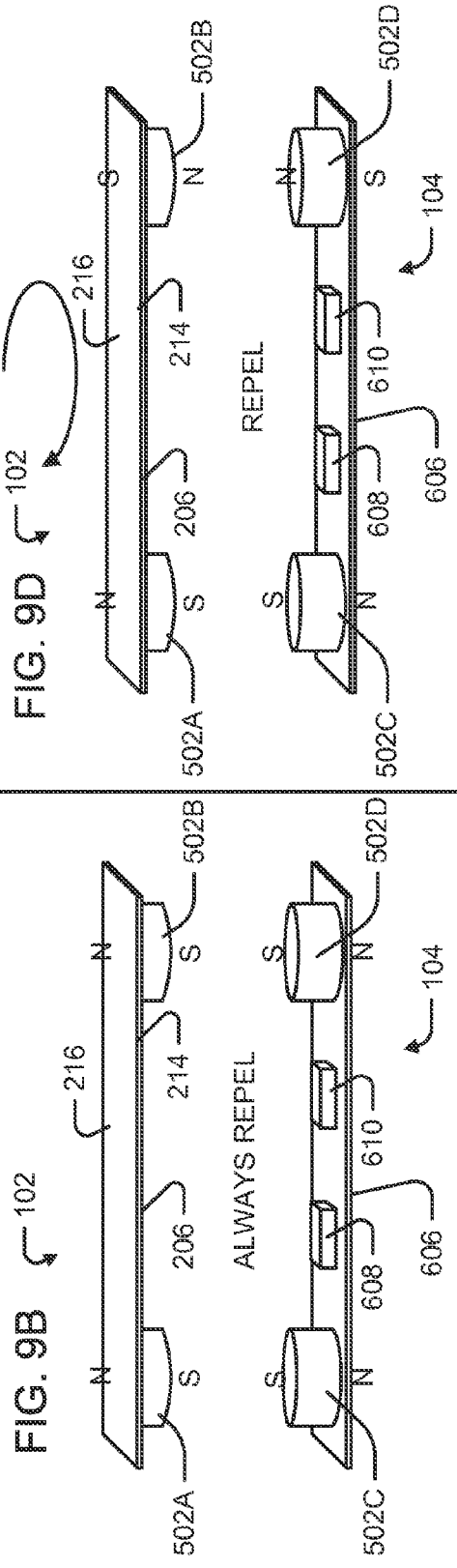
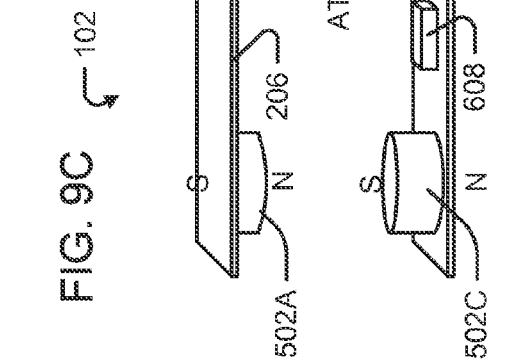
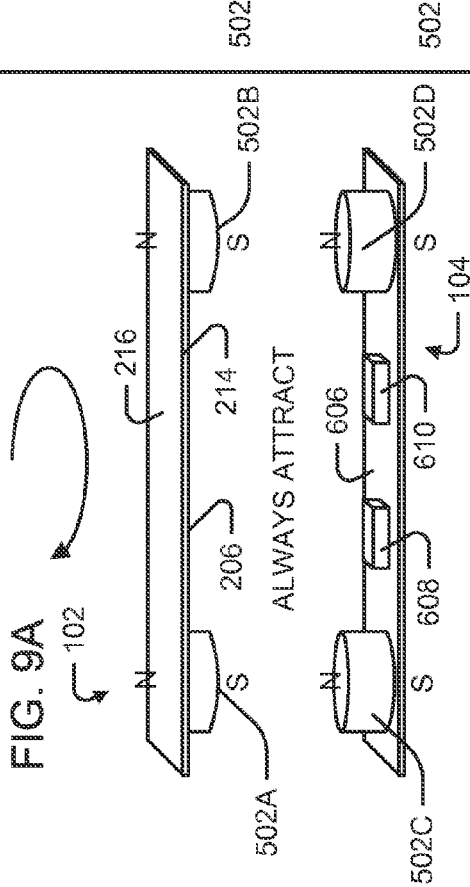

CONNECTORS PROVIDING HAPTIC FEEDBACK

RELATED APPLICATION

This application claims the benefit of U.S. Provisional Application No. 61/570,707, filed Dec. 14, 2011, which application is incorporated herein by reference in its entirety.

This application is a continuation of co-pending U.S. application Ser. No. 13/713,564, filed Dec. 13, 2012, which is incorporated by reference in its entirety

FIELD OF THE INVENTION

The present disclosure relates to electronic devices and more specifically to connectors for electronic devices.

BACKGROUND

Advances in semiconductor manufacturing and circuit design technologies have enabled the development and production of integrated circuits (ICs) with increasingly higher operational frequencies. In turn, electronic products and systems incorporating such integrated circuits are able to provide much greater functionality than previous generations of products. This additional functionality has generally included the processing of increasingly larger amounts of data at increasingly higher speeds.

Many electronic systems include multiple printed circuit boards (PCBs) upon which these high-speed ICs are mounted, and through which various signals are routed to and from the ICs. In electronic systems with at least two PCBs and the need to communicate information between those PCBs, a variety of connector and backplane architectures have been developed to facilitate information flow between the boards. Unfortunately, such connector and backplane architectures introduce a variety of impedance discontinuities into the signal path, resulting in a degradation of signal quality or integrity. Connecting to boards by conventional means, such as signal-carrying mechanical connectors, generally creates discontinuities, requiring expensive electronics to negotiate. Conventional mechanical connectors may also wear out over time, require precise alignment and manufacturing methods, and are susceptible to mechanical jostling.

BRIEF SUMMARY

In one example, first connector may include a housing that may define a first connector face configured to be positioned in at least one of a first position and a second position proximate to a second connector face of a second connector. The first connector may also include a first extremely high frequency (EHF) communication unit disposed in the housing relative to the first connector face for communicating with a second EHF communication unit of the second connector when the first connector face is positioned in at least one of the first position and the second position relative to the second connector face. The first connector may further include a first magnet disposed in the housing relative to the first connector face. The first magnet may be configured to align with and repel a second magnet disposed relative to the second connector face when the first connector face is positioned in the second position relative to the second connector face. Further, the first magnet may be configured not to align with and not to repel the second magnet when the first connector face is positioned in the first position relative to the second connector face.

In another example, a connector system may include a first connector and a second connector. The first connector may include a first housing defining a first connector face. The first connector may also include a first EHF communication unit disposed in the first housing relative to the first connector face. The first connector may also include a first magnet disposed in the first housing relative to the first connector face. The second connector may include a second housing defining a second connector face configured to be positioned in at least one of a first position and a second position proximate to the first connector face. The second connector may further include a second EHF communication unit configured to communicate with the first EHF communication unit over a first channel when the first connector face is positioned in at least one of the first position and the second position relative to the second connector face. The second connector may also include a second magnet disposed in the second housing relative to the second connector face. The second magnet may be configured not to align with and not to repel the second magnet when the first connector face is positioned in the first position relative to the second connector face. Further, the second magnet may be configured to align with and repel the first magnet when the first connector face is positioned in the second position relative to the second connector face.

In yet another example, a connector system may include a first connector and a second connector. The first connector may include a first housing, a first EHF communication unit supported in the first housing, a third EHF communication unit supported in the second housing and configured to communicate with a fourth EHF communication unit on a second channel. The first connector may also include at least two first connector magnets supported in the first housing. The second connector may be configured to couple with the first connector. The second connector may define a second connector face configured to be positioned in at least one of a first position and a second position proximate to the first connector face. The second connector may also include a second EHF communication unit supported in the second housing and configured to communicate with the first EHF communication unit over the first channel. The second connector may also include a fourth EHF communication unit supported in the second housing and may be configured to communicate with the third communication unit on a second channel. The second connector may also include at least two second connector magnets supported in the second housing. The polarities of the at least two first connector magnets, and the at least two second connector magnets are oriented such that the first connector couples with the second connector in a desired connector orientation and is held in a coupled state by attraction of the first magnet of the at least two first connector magnets to the first magnet of the at least two second connect magnets and attraction of the second magnet of the first connector magnets to the second magnet of the second connector magnets.

BRIEF DESCRIPTION OF THE SEVERAL VIEWS OF THE DRAWINGS

Figure 1:
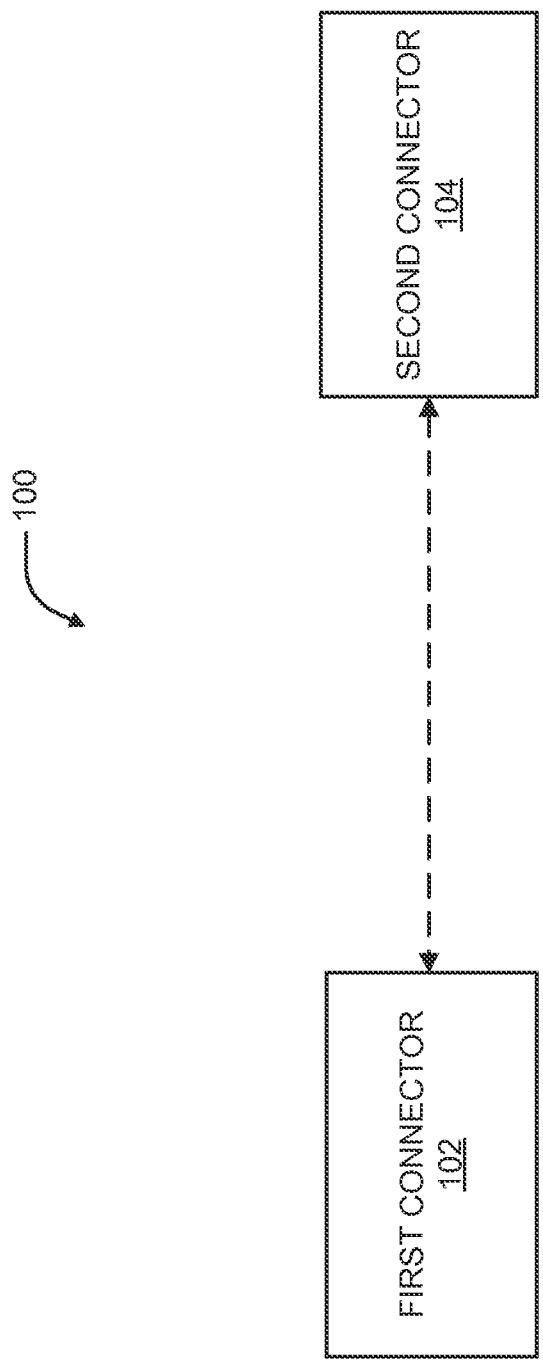
Figure 2:
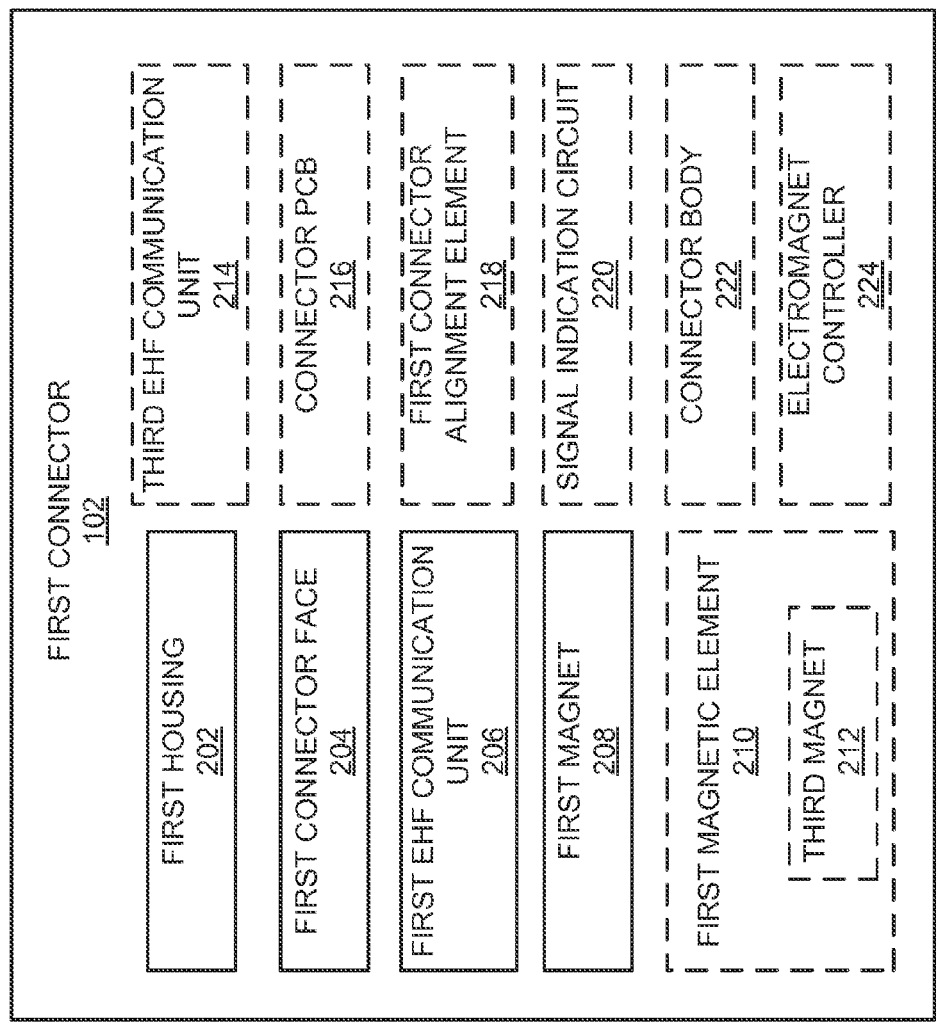
Figure 3:
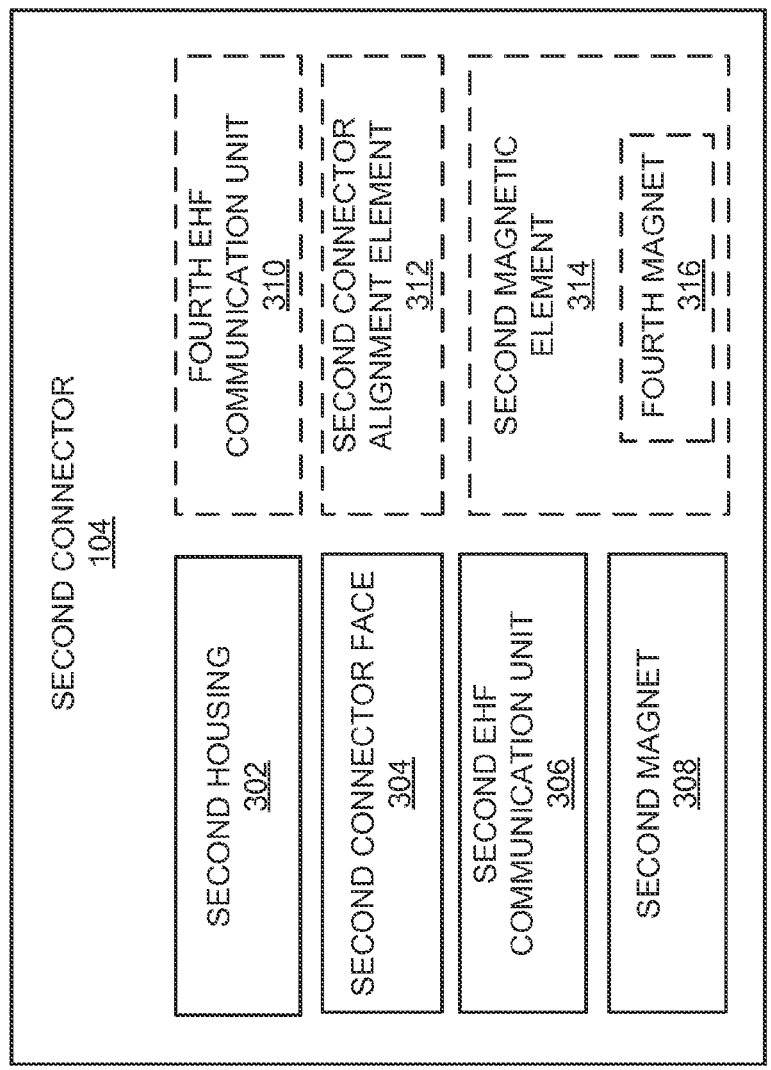
Figure 4:
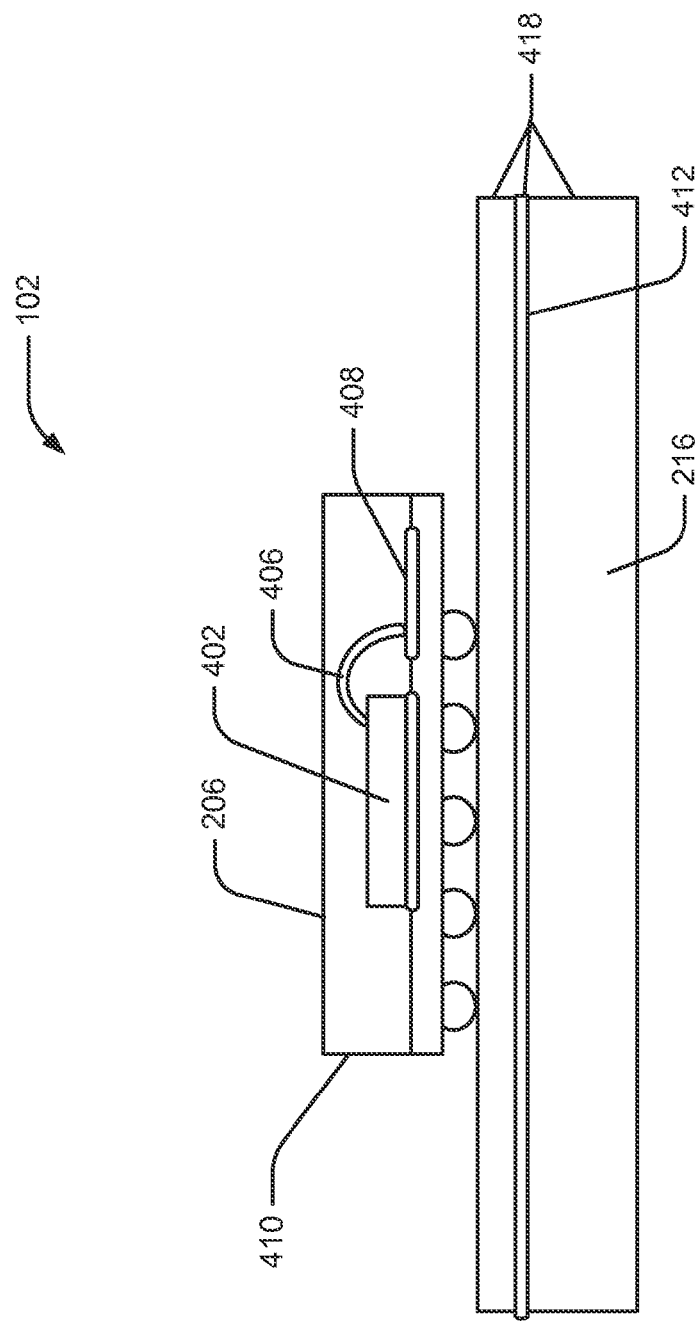
Figure 5:
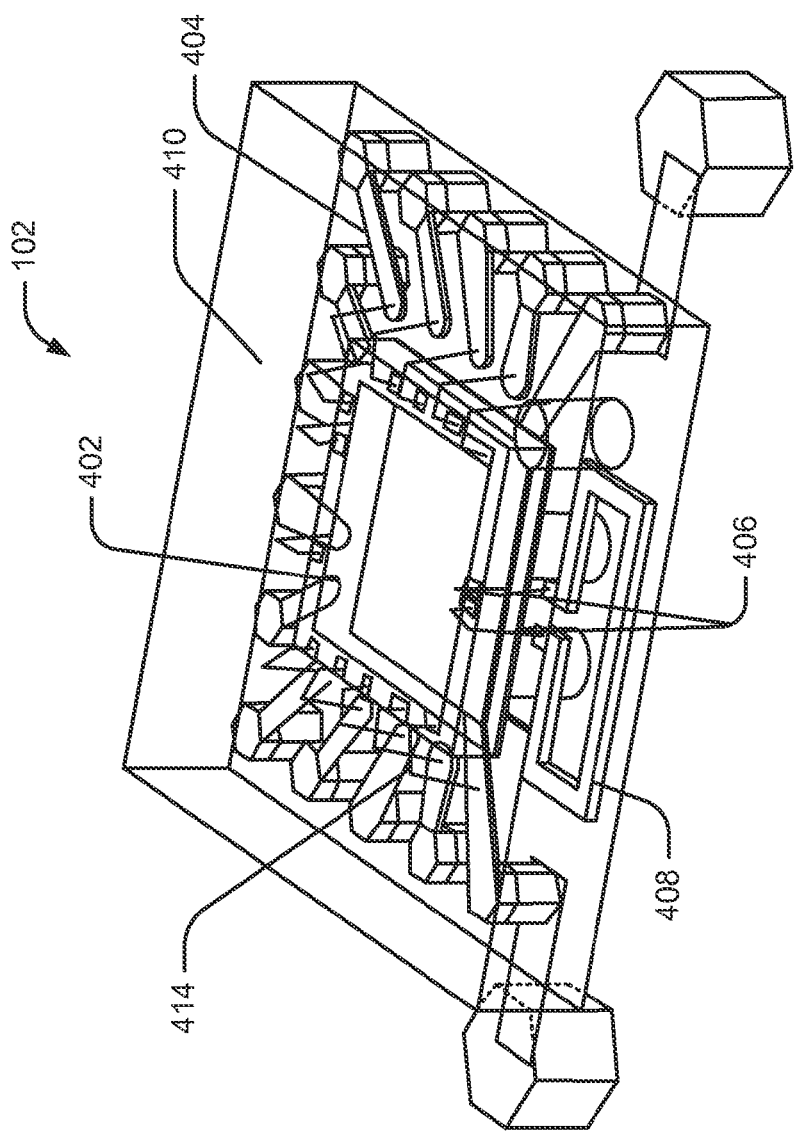
Figure 6:
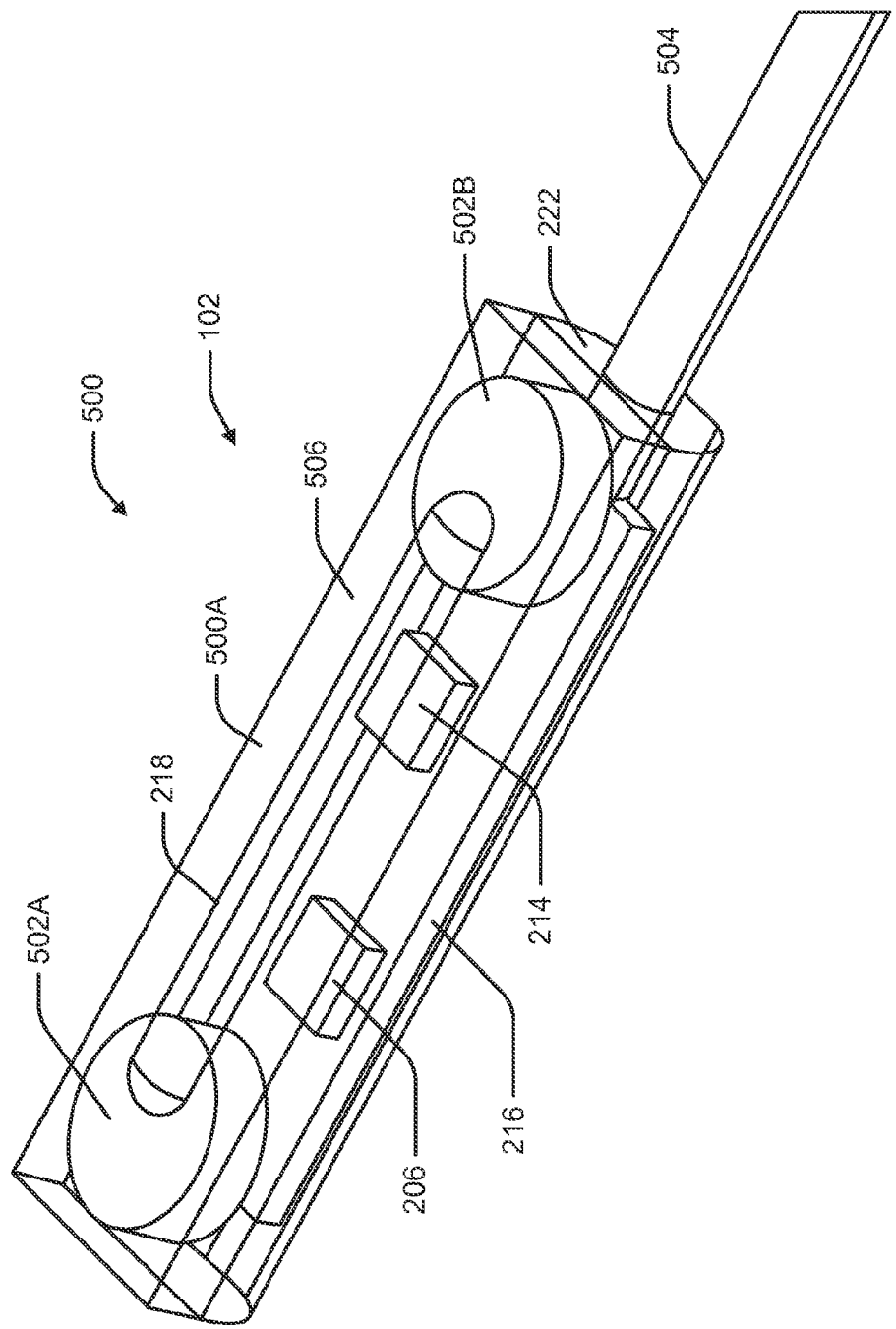
Figure 7:
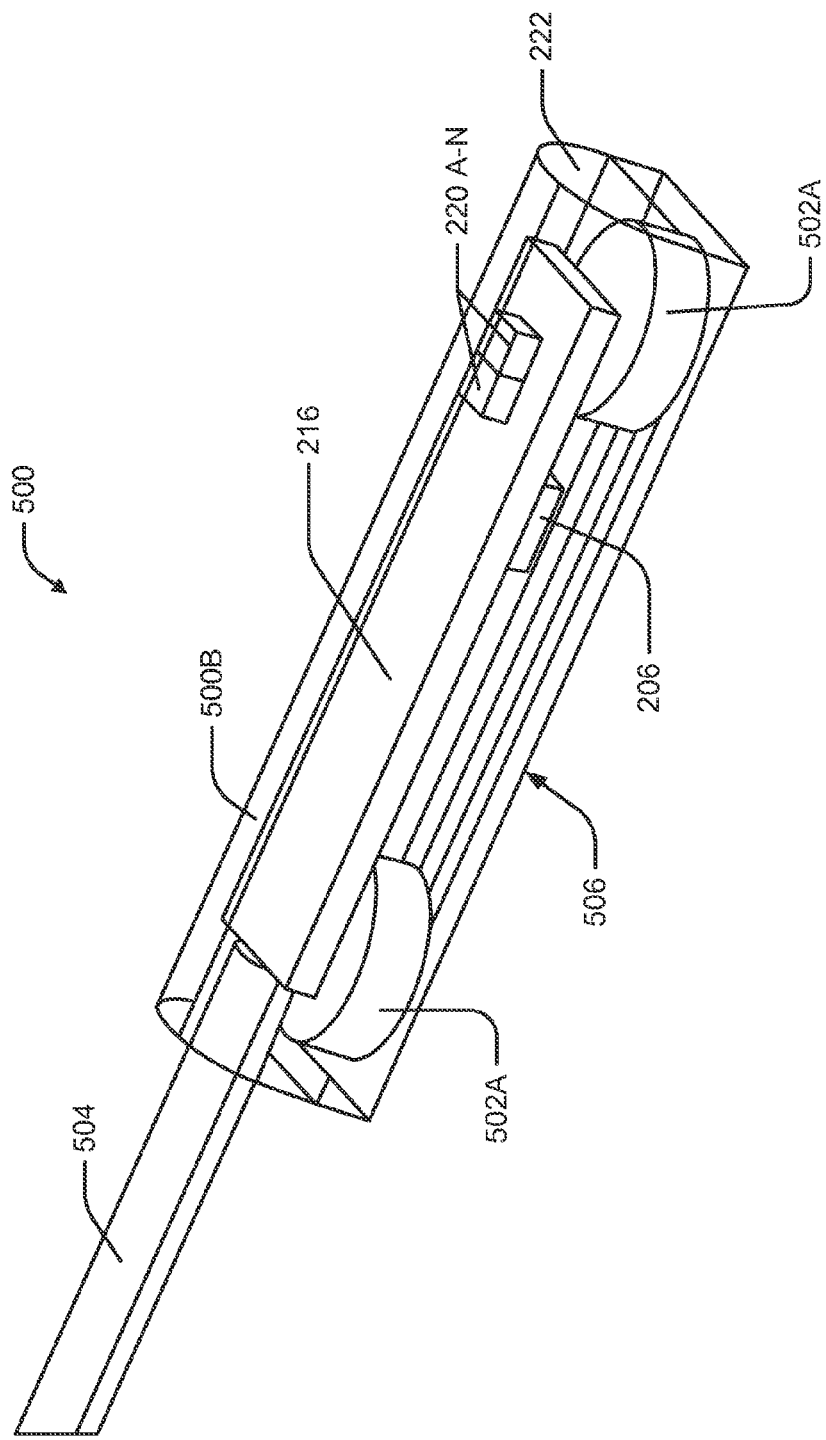
Figure 8:
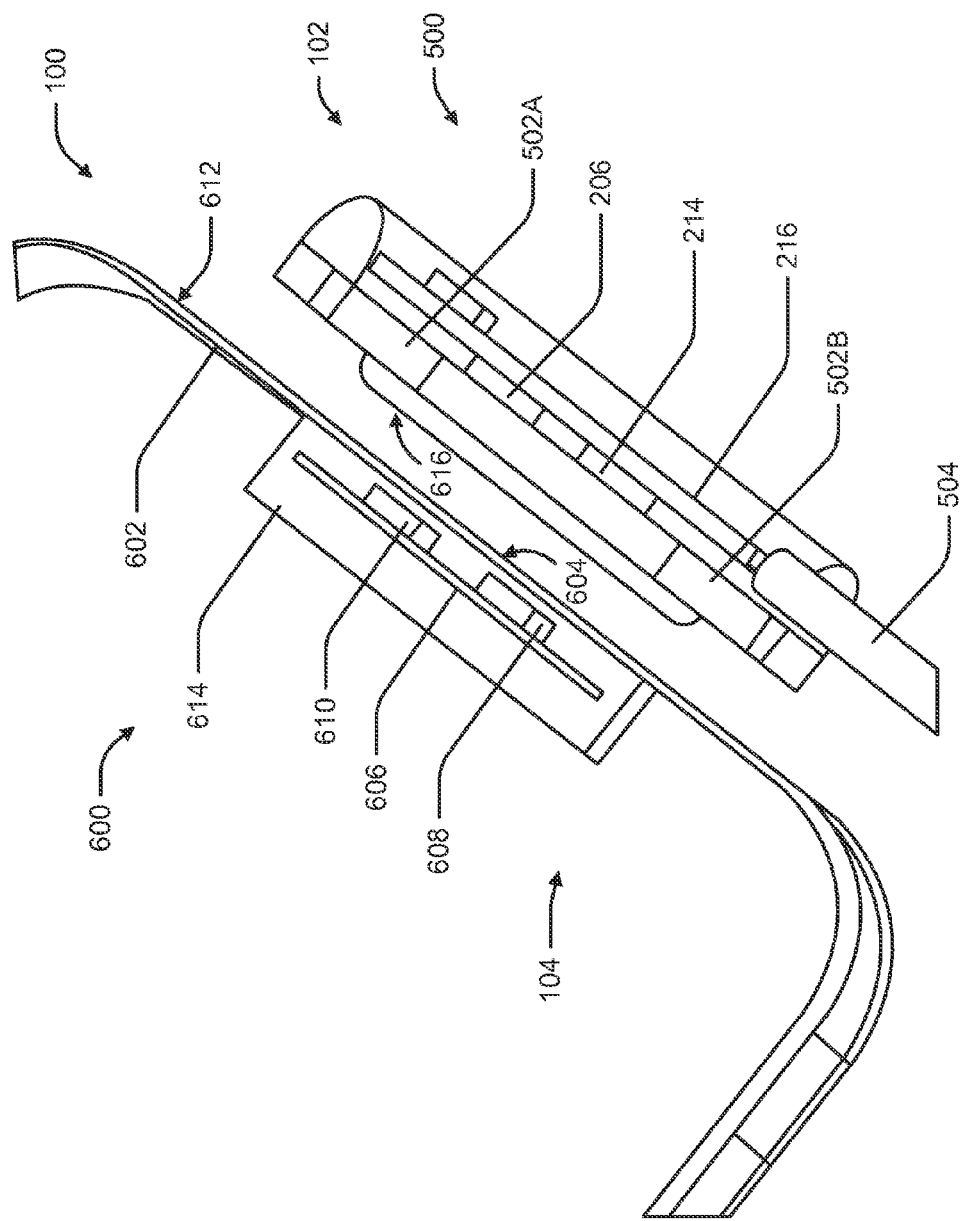
Figure 10:
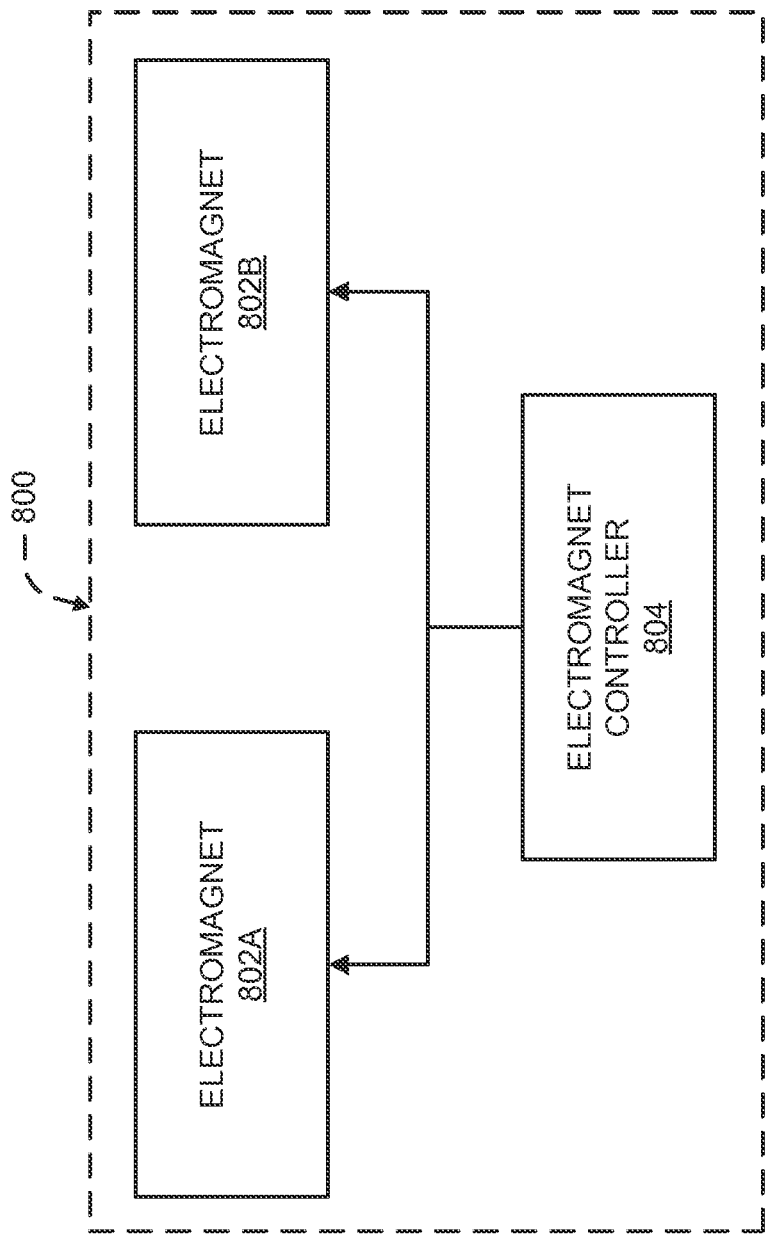
Figure 11:
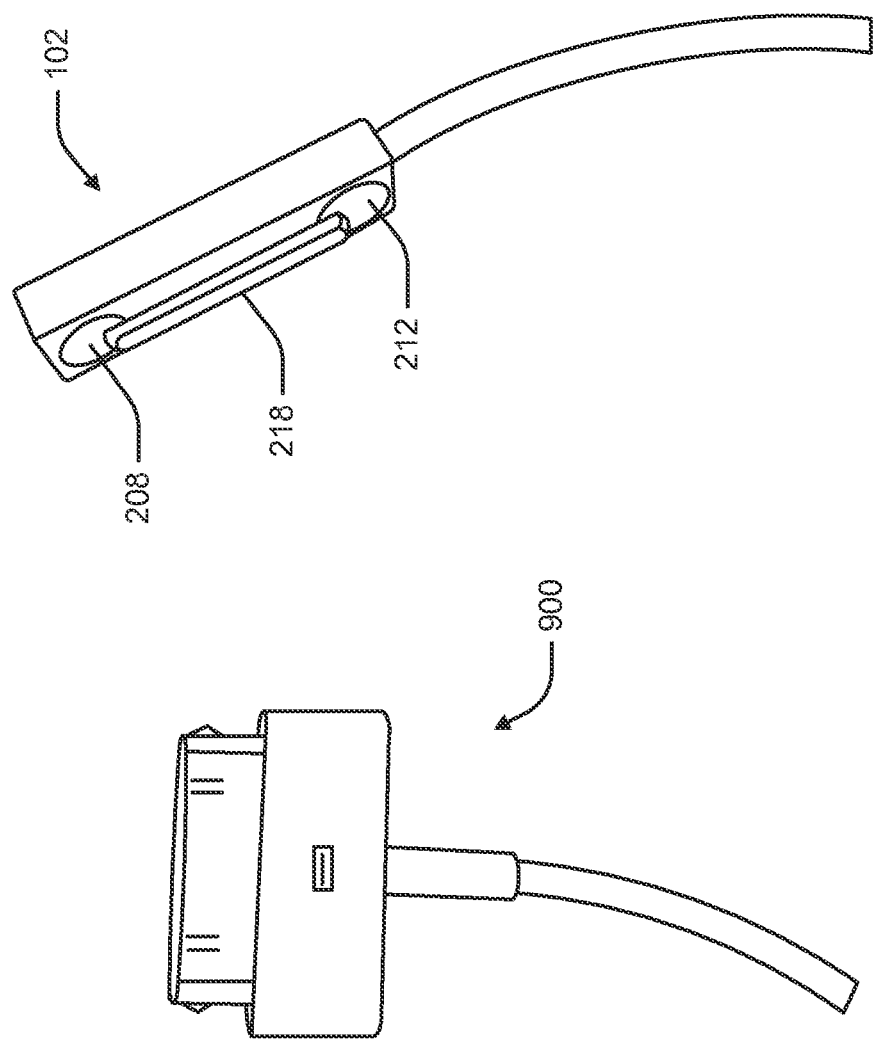

Having thus described the invention in general terms, reference will now be made to the accompanying drawings, which are not necessarily drawn to scale, and wherein:

FIG. 1 illustrates a general connector system,

FIG. 2 illustrates structural components of a first connector,

FIG. 3 illustrates structural components of a second connector,

FIG. 4 is side view of a first EHF communication unit mounted on a printed circuit board and showing some internal components, FIG. 5 is an isometric view of the first EHF communication unit of FIG. 4, FIG. 6 illustrates an isometric view of an illustrative first connector of FIG. 1 showing a first connector face, FIG. 7 an isometric view illustrating a back side of the first connector of FIG. 6, FIG. 8 is an isometric view of a connector system including the first connector of FIG. 6 proximate to a second connector, FIGS. 9A-9D illustrates simplified exemplary configurations of magnetic components of a connector system including a first connector and a second connector usable in the connector system of FIG. 1 or FIG. 8, FIG. 10 is a block diagram of an illustrative connector having electromagnetic components, and FIG. 11 illustrates exemplary first and second connectors that may form an example of the connector system of FIG. 1.

DETAILED DESCRIPTION

Illustrative embodiments now will be described more fully hereinafter with reference to the accompanying drawings, in which some, but not all embodiments of connectors and connector systems are shown. Indeed, connectors and connector systems may be embodied in many different forms and should not be construed as limited to the embodiments set forth herein; rather, these embodiments are provided so that one skilled in the art can make and use the connectors and connector systems disclosed. Like numbers refer to like elements throughout.

Connectors interconnect electronic devices and provide a pathway for signal and/or power transfer. Data transfer may be at very high rates. Connector systems are preferably easily manufactured, modular, and efficient. Examples of communication systems are disclosed in U.S. Pat. No. 5,621,913 and U.S. patent application Ser. No. 12/655,041. The disclosures of these and all other publications referenced herein are incorporated by reference in their entirety for all purposes.

In today's society and ubiquitous computing environment, high-bandwidth modular and portable memory devices are being used increasingly. Security and stability of communication between and within these devices is important. In order to provide improved secure high-bandwidth communications, EHF communication units may be utilized. An example of an EHF communications unit is an EHF comm-link chip. Throughout this disclosure, the terms comm-link chip, comm-link chip package, and EHF communication link chip package will be used to refer to EHF antennas embedded in IC packages. Examples of such comm-link chips are described in detail in U.S. Patent Application Publication Nos. 2012/0263244; and 2012/0307932, both of which are hereby incorporated in their entireties for all purposes. Comm-link chips are an example of a communication device, also referred to as communication unit, whether or not they provide wireless communication and whether or not they operate in the EHF frequency band.

FIG. 1 illustrates a connector system 100 where various embodiments of the present disclosure may function. As shown, the connector system 100 may include a first connector 102 configured to couple to a second connector 104. An example of structural components of the first connector 102 is illustrated in FIG. 2 and an example of structural components of the second connector 104 is illustrated in FIG. 3.

Referring to FIGS. 2 and 3, the first connector 102 may include a first housing 202 defining a first connector face 204 configured to be positioned in at least one of a first position and a second position proximate to a second connector face 304 of the second connector 104 (See FIG. 3). Hereinafter, the first housing 202 and a housing 202 may refer to same component and may be used interchangeably without changing its meaning.

The first connector 102 may also include a first extremely high frequency (EHF) communication unit 206 disposed in the housing 202 relative to the first connector face 204 for communicating with a second EHF communication unit 306 of the second connector 104 when the first connector face 204 is positioned in at least one of the first position and the second position relative to the second connector face 304. Further, the first EHF communication unit 206 may be electrically and physically connected to a cable (not shown in these figures) configured to receive at least one of power and one or more informational signals from an external source. The external source may be a power source or other electrical or electronic device and may not be part of the first connector 102.

The first connector 102 may further include a first magnet 208 disposed in the housing 202 relative to the first connector face 204. The first magnet 208 may be configured to align with and repel a second magnet 308 disposed relative to the second connector face 304 when the first connector face 204 is positioned in the second position relative to the second connector face 304. Further, the first magnet 208 may be configured not to align with and not to repel the second magnet 308 when the first connector face 204 is positioned in the first position relative to the second connector face 304. In an embodiment, the first magnet 208 has a magnet face that may be aligned with the first connector face 204.

In some examples, the first connector 102 may further include a first magnetic element 210 disposed in the housing 202 relative to the first connector face 204 and spaced away from the first magnet 208. The first magnetic element 210 may be configured to align with and/or attract the second magnet 308 when the first connector face 204 is positioned in the first position relative to the second connector face 304. Further, the first magnetic element 210 may be at least one of, but not limited to, a permanent magnet, an electromagnet, and a ferromagnetic element. In an embodiment, the first magnetic element 210 may be a third magnet 212. The first magnet 208 and the third magnet 212 may have opposite magnetic polarities at the first connector face 204.

The first connector 102 may further include a third EHF communication unit 214 that may be configured to communicate with a fourth EHF communication unit 310 of the second connector 104 when the first connector face 204 is positioned in the at least one of the first position and the second position relative to the second connector face 304.

The first connector 102 may further include a connector printed circuit board (PCB) 216 supported in the housing 202. Further, the first connector 102 may include a first connector alignment element 218 configured to mate with a complementary second connector alignment element 312 of the second connector 104. The first connector alignment element 218 may matingly receive the second connector alignment element 312 when the first connector face 204 is positioned in the first position and in the second position relative to the second connector face 304 for providing physical alignment feedback to a user. The physical alignment feedback may be one or a combination of haptic feedback, tactile feedback or visual feedback.

The first connector 102 may include a signal indication circuit 220 having one or more light emitting diode (LED)

indicators. The connection circuit may be responsive to an electrical signal transmitted between the first and second EHF communication units.

Furthermore, the first connector 102 may include a connector body 222 disposed in the housing 202 and configured to encapsulate the connector PCB 216 and the first EHF communication unit 206. The first magnet 208 may be configured to act as an electromagnet. Further, the first connector 102 may include an electromagnet controller 224 configured to alternatingly activate and either deactivate or reverse activate the electromagnet (i.e. the first magnet 208), thereby producing vibration of the first connector 102.

As shown in FIG. 3, the second connector 104 may include a second housing 302 defining the second connector face 304 configured to be positioned in at least one of a first position and a second position proximate to the first connector face 204. The second EHF communication unit 306 may be configured to communicate with the first EHF communication unit 206 over a first channel when the first connector face 204 is positioned in at least one of the first position and the second position relative to the second connector face 304.

Further, the second connector 104 may include the second magnet 308 disposed in the second housing 302 relative to the second connector face 304. The second magnet 308 may be configured not to align with and not to repel the second magnet 308 when the first connector face 204 is positioned in the first position relative to the second connector face 304. Further, the second magnet 308 may be configured to align with and repel the first magnet 208 when the first connector face 204 is positioned in the second position relative to the second connector face 304. Further, the first magnetic element 210 and the second magnetic element 314 may include respective ferromagnetic elements. The fourth EHF communication unit 310 may be disposed in the second housing 302 relative to the second connector face 304.

Further, the second connector 104 may include a second magnetic element 314 disposed in the second housing 302 relative to the second connector face 304. The second magnetic element 314 may be configured to align with and be attracted to the first magnet 208 when the first connector face 204 is positioned in the first position relative to the second connector face 304. Further, the second magnetic element may include a fourth magnet 316 disposed in the second housing 302 relative to the second connector face 304. Further, the fourth magnet 316 may be configured to align with and to attract the first magnet 208 when the first connector face 204 is positioned in the first position relative to the second connector face 304. Further, the fourth magnet 316 may be configured to align with and repel the third magnet 212 when the first connector face 204 is positioned in the second position relative to the second connector face 304.

FIG. 4 is side view of an example of the first EHF communication unit of the first connector 102 showing some internal components. FIG. 5 is an isometric view of an example of the first EHF communication unit 206 of the first connector 102. As discussed with reference to FIG. 2, the first EHF communication unit 206 may be mounted on the connector printed circuit board (PCB) 216 of the first connector 102. FIG. 5 shows a similar illustrative first EHF communication unit 206. It is noted that FIGS. 4 and 5 portray a first EHF communication unit 206 using computer simulation graphics, and thus some components may be shown in a stylized fashion. As illustrated, the first EHF communication unit 206 may include a die 402, a lead frame 404, one or more conductive connectors such as bond wires 406, a transducer such as an antenna 408, and an encapsulating material 410.

The die 402 may include any suitable structure configured as a miniaturized circuit on a suitable die substrate, and is functionally equivalent to a component also referred to as a "chip" or an "integrated circuit (IC)." The die substrate may be formed using any suitable semiconductor material, such as, but not limited to, silicon. The die 402 may be mounted in electrical communication with the lead frame 404. The lead frame 404 may be any suitable arrangement of electrically conductive leads configured to allow one or more other circuits to operatively connect with the die 402. The leads of the lead frame 404 may be embedded or fixed in a lead frame substrate. The lead frame substrate may be formed using any suitable insulating material configured to substantially hold the leads in a predetermined arrangement.

Further, the electrical communication between the die 402 and leads of the lead frame 404 may be accomplished by any suitable method using conductive connectors such as, one or more bond wires 414. The bond wires 414 may be used to electrically connect points on a circuit of die 402 with corresponding leads on the lead frame 404. In another embodiment, the die 402 may be inverted and conductive connectors including bumps, or die solder balls rather than bond wires 414, which may be configured in what is commonly known as a "flip chip" arrangement.

The antenna 408 may be any suitable structure configured as a transducer to convert between electrical and electromagnetic signals. The antenna 408 may be configured to operate in an EHF spectrum, and may be configured to transmit and/or receive electromagnetic signals, in other words as a transmitter, a receiver, or a transceiver. In an embodiment, the antenna 408 may be constructed as a part of the lead frame 404. In another embodiment, the antenna 408 may be separate from, but operatively connected to the die 402 by any suitable method, and may be located adjacent to the die 402. For example, the antenna 408 may be connected to the die 402 using antenna bond wires 416. Alternatively, in a flip chip configuration, the antenna 408 may be connected to die 402 without the use of the antenna bond wires 416. In other embodiments, the antenna 408 may be disposed on the die 402 or on the PCB 216.

Further, the encapsulating material 410 may hold the various components of the first EHF communication unit 206 in fixed relative positions. The encapsulating material 410 may be any suitable material configured to provide electrical insulation and physical protection for the electrical and electronic components of first EHF communication unit 206. For example, the encapsulating material 410 may be a mold compound, glass, plastic, or ceramic. The encapsulating material 410 may be formed in any suitable shape. For example, the encapsulating material 410 may be in the form of a rectangular block, encapsulating all components of the first EHF communication unit 206 except the unconnected leads of the lead frame 404. One or more external connections may be formed with other circuits or components. For example, external connections may include ball pads and/or external solder balls for connection to a printed circuit board.

In FIG. 4, it may be seen that the die 402 is encapsulated in the first EHF communication unit 206, with the bond wires 414 connecting the die 402 with the antenna 408. In this embodiment, the first EHF communication unit 206 may be mounted on the connector PCB 216. The connector PCB 216 may include one or more laminated layers 418, one of which may be PCB ground plane 412. The PCB ground plane 412 may be any suitable structure configured to provide an electrical ground to circuits and components on the PCB 216.

The second EHF communication unit 306 may be included and configured to allow EHF communication between the first EHF communication unit 206 and the second EHF communication unit 306. Further, either of the EHF communication units 206 or 306 may be configured to transmit and/or receive electromagnetic signals, providing one-way or two-way communication between the first EHF communication unit 206 and the second EHF communication unit 306 and accompanying electronic circuits or components. In an embodiment, the first EHF communication unit 206 and the second EHF communication unit 306 may be co-located on the single PCB 216 and may provide intra-PCB communication. In another embodiment, the first EHF communication unit 206 may be located on a first PCB (similar to PCB 216) and the second EHF communication unit 306 may be located on a second PCB (similar to PCB 216) and may therefore provide inter-PCB communication.

Regardless of where the first EHF communication unit 206 and the second EHF communication unit 306 are mounted, it remains important to provide improved signal security and integrity when communicating between any two EHF communication units (such as EHF communication units 206, 306). One method for enhancing or ensuring proper signal security and integrity is to verify that the second EHF communication unit 306 is within a predetermined range before or during a communication attempt. To that end, systems and methods for detecting the presence of the second EHF communication unit 306 and/or for ensuring another device or surface is within a certain distance may be included. Examples of such systems and methods are described in U.S. patent application Ser. No. 13/524,956, which is hereby incorporated in its entirety for all purposes.

FIG. 6 illustrates a front face 500A of an example 500 of the first connector 102. FIG. 7 illustrates a back face 500B of connector 500. The first connector 102 may be any suitable connector component configured to provide a zero-insertion or low-insertion EHF connection interface for a corresponding connector component on another device or system. The first connector 102 may include two magnets, 502A and 502B. As discussed with reference to FIGS. 1-3 and FIGS. 4 and 5, the first connector 102 may further include the first EHF communication unit 206, the third communication unit 214, the connector PCB 216, the connector body 220, the first connector alignment element 218, and/or one or more LED indicators 222A-N. Furthermore, the first connector 102 may be electrically and physically connected to a cable 504.

The connector body 222 may serve as a housing or container for other components of the first connector 102. In some embodiments, the connector body 222 may encapsulate the PCB 216, the first EHF communication unit 206, the third EHF communication unit 214, and one or more LED indicators 220A-N using a suitable dielectric material or materials such as plastic. Further, the connector body 222 may also be sized and configured to allow convenient manipulation by a user. In an embodiment, the magnets 502A and 502B may be at least partially housed in the connector body 222 and may be mounted such that both magnets 502A-502B may flush with the mating surface 506 of the connector body 222.

The mating surface 506 may be configured to provide a suitable physical coupling surface with a corresponding connector on a corresponding device such as the external device 602 shown in FIG. 9. In some embodiments, the mating surface 506 is coplanar with a surface of the external device 602. In other embodiments, the mating surface 506 is curved. In still other embodiments, the mating surface 506 may include the first connector alignment element 218. The first connector alignment element 218 may be a protrusion, ridge, knob, bevel, pin, recess, or other member configured to mate with a corresponding alignment element on a corresponding second connector face 304 (or connector surface 604 of the external device 602), to provide physical alignment feedback to the user. The second connector face 304 (or connector surface 604 of the external device 602) may be a target connection region for the first connector 102.

The magnets 502A and 502B (or first connector magnets 502A-502B) may be any suitable magnetic components configured to non-destructively releasably hold the first connector 102 in aligned proximity to the second connector face 304 (or the connector surface 604 of the external device 602). Hereinafter, the magnets 502A-502B may be referred as first connector magnets 502A-502B without changing its meaning. The second connector 104 may be a part of the external device 602.

Further, the second connector 104 may include at least two magnets (or second connector magnets), such as shown in FIGS. 9A-9D. In this context, the alignment and proximity may refer to the alignment and proximity of corresponding EHF communication unit (e.g. 206), which must be substantially aligned and in close enough proximity to enable communication between a given pair of EHF communication units. In some embodiments, the magnets 502A, 502B are one or a combination of permanent magnets, electromagnets, or be formed of ferrous material capable of being magnetically attracted to magnets.

The first EHF communication unit 206 and the third EHF communication unit 214 may be mounted on the connector PCB 216. In some embodiments, more or fewer EHF communication units may be provided in the first connector 102 or the PCB 216. The first EHF communication unit 206 may be mounted on the PCB 216 in an orientation that is orthogonal to that of the third EHF communication unit 214, to take advantage of polarization effects. Orthogonal orientation may allow the EHF communication units (e.g. 206 or 214) to be mounted closely together, because orthogonal EHF signals may not substantially interfere with each other. The connector PCB 216 and related circuits may be electrically connected to the cable 504 to allow the first connector 102 to obtain power and/or informational signals from a source outside of the first connector 102. For example, the cable 504 may provide the first connector 102 with electrical power as well as providing a signal path to and/or from a personal computer or other associated device.

A shielding material (not shown) may be provided around at least a portion of the connector body 222. The shielding material may include any electrically conductive material or a layer configured to absorb or otherwise block the EHF radiation. In an embodiment, the magnets 502A and/or 502B, possibly in combination with the shielding material, may provide a circuit ground for one or more circuits in the first connector 102.

Furthermore, a first magnet of the first connector magnets 502A and 502B may be electrically connected to a power conductor in the cable 504, and a second magnet of the first connector magnets 502A and 502B may be connected to a circuit ground. This configuration may allow power to be provided to the external device 602 through the magnets 502A and 502B. The magnets 502A-502B may be shaped accordingly to provide a suitable electrical interface when aligned and mated with the connector surface 604 of the external device 602. In an embodiment, the magnets 502A and 502B may have protrusions to provide controlled point connections and to avoid "a-spot" problems inherent in flat connector surfaces.

One or more LED indicators 220A-N may be mounted in or on the first connector 102 to provide visual feedback to the user. The LED indicators 220A-N may be electrically connected to the connector PCB 216 and may provide indication of a connector, connection status, or signal transmission status. In an embodiment, the LED indicators 220A-N may blink or light up if the connector 102 is receiving power and to confirm a proper or correct connection. In other embodiments, a green LED indicator 220N may light up if the connector 102 is properly aligned and affixed to the connector surface 604 of the external device 602.

FIG. 6 is an isometric view of a connector system 600 including the first connector 102 or 500 proximate to the second connector 104 or 600. The external device 602 may include the second connector (such as connector 104) having a second housing 614 defining a second connector face or connector surface 604 configured to be positioned in at least one of a first position and a second position proximate to the first connector face 616. It will be appreciated that the first and second connectors can be placed together in a first position with EHF communication unit 206 aligned with EHF communication unit 610 and EHF communication unit 214 aligned with EHF communication unit 608, or in a second position that is the reverse.

As depicted, the external device 602 may include an external device PCB 606 with two EHF communication units 608 and 610 disposed near an edge 612 of the external device 602. The EHF communication units of the external device 602 may be referred as a second EHF communication unit 608 and a fourth EHF communication unit 610. In some examples, more or fewer EHF communication units may be provided. The second EHF communication unit 608 may be configured to communicate with the first EHF communication unit 206 over a first channel when the first connector face 616 is positioned in at least one of the first position and the second position relative to the second connector face 604. Hereinafter, the connector surface 604 and second connector face 604 may be used interchangeably without changing their meaning.

Further, the connector surface 604 at the edge 612 may include portions made of ferrous material or any other material that provides a magnetically attractive surface to which the first connector magnets 502A-502B may attach. Further, the first magnet 502A may have a magnet face that is aligned with the first connector face 616. In an embodiment, placing the first connector 102 near the connector surface 604 of the external device 602 may cause the magnets 502A and 502B to be attracted to the connector surface 604, pulling the connector 102 into proper position and alignment to allow the first EHF communication unit 206, the third EHF communication unit 214, the second EHF communication unit 608, and the fourth EHF communication unit 610 to align and communicate. In some embodiments, the first connector magnets 502A and 502B may be connected to a power-providing circuit, this attraction and holding of the first connector 102 may also facilitate electrical power conduction.

In some embodiments, the second connector 104 of the external device 602 may include a second magnet (similar to magnet 308) disposed in the second housing 614 of the external device 602. The second magnet may be disposed in the second housing 614 relative to the second connector face 604. In an embodiment, the second magnet may be configured not to align with and not to repel the second magnet when the first connector face 616 is positioned in the first position relative to the second connector face 604. Furthermore, the second magnet is configured to align with and repel the first magnet when the first connector face 616 is positioned in the second position relative to the second connector face 604.

As discussed with reference to FIGS. 3-5, the first connector 102 may include the first magnetic element (502B) disposed in the first housing 202 relative to the first connector face 616 (or 204) and spaced from the first magnet 502A (or 208). The first magnetic element (502B) may be configured to align with and attract the second magnet (e.g. magnet 308) when the first connector face 616 is positioned in the first position relative to the second connector face 604. Further, the first magnetic element 218 may be at least one of a permanent magnet, an electromagnet, and a ferromagnetic element. In an embodiment, the first magnetic element (or magnet 502B) may be a third magnet 212 of the first connector 102. Further, the first magnet 502A (or 208) and the third magnet 502B (or 212) may have opposite magnetic polarities at the first connector face 616.

In an embodiment, the second connector 104 of the external device 602 may include a fourth magnet (not shown in FIG. 6, but it is similar to fourth magnet 308 of FIG. 3) disposed in the second housing 614 relative to the second connector face 604. The fourth magnet may be configured to align with and to attract the first magnet 208 when the first connector face 616 is positioned in the first position relative to the second connector face 604. Further, the fourth magnet (such as magnet 308) may be configured to align with and repel the third magnet when the first connector face 616 is positioned in the second position relative to the second connector face 604.

The second connector 104 may further include the second magnetic element (such as one of the magnets 502C-502D) disposed in the second housing 614 relative to the second connector face 604. Further, the second magnetic element (such as one of the second connector magnets shown in FIGS. 9A-9D) may be configured to align with and be attracted to the first magnet when the first connector face is positioned in the first connector face 616 is positioned in the first position relative to the second connector face 604. The first magnetic element and the second magnetic element may include respective ferromagnetic elements.

In an embodiment, the first connector 102 may further include the third EHF communication unit 214 disposed in the first housing 202 relative to the first connector face 616 (or 204). In another embodiment, the second connector 104 may further include the fourth EHF communication unit 310 disposed in the second housing 614 (or 304) relative to the second connector face 604. The third EHF communication unit 214 may be configured to communicate with the fourth EHF communication unit 310 when the first connector face 616 is positioned in the at least one of the first position and the second position relative to the second connector face 604. FIGS. 9A-9D illustrate exemplary configurations of magnetic components of the connector system 600 including the first connector 102 and the second connector 104 of FIGS. 1-3. As shown, the connector surface 604 (or the second connector face 304) may include one or more magnets 502C and 502D. Including the magnets 502C and 502D at or near the connector surface 604 of the external device 602 allows additional functionality and additional haptic feedback to a user. Further, the magnets 502A-502B (or first connector magnets) may be configured to provide a ground connection in the electrical circuit and may be configured to form in combination an electromagnetic shield around the first EHF communication unit 206 and the third EHF communication unit 214.

Each of the first connector magnets 502A-502B may have a first pole of a first polarity and a second pole of a second polarity opposite of the first polarity, and the respective first poles of the first connector magnets 502A-502B may be oriented in the same direction. Similarly, each second connector magnets 502C-502D may have a first pole of a first polarity and a second pole of a second polarity opposite of the first polarity, and the respective first poles of the second connector magnets 502C-502D may be oriented in the same direction.

In different examples, various alignments of the poles of magnets 502A, 502B, 502C, and 502D may be possible. These alignments and combinations of alignments may allow tactile feedback regarding proper alignment and positioning of the first connector 102 at the connector surface based on the attraction or repulsion of the aligned magnet pairs.

As shown in FIG. 9A, a connector system may be configured such that the first connector 102 may connect in either of two orientations. In this embodiment, poles of one set of magnets are aligned and presented to opposing poles of another aligned set of magnets. In other words, magnets 502A and 502B may always present their south poles to the magnets 502C and 502D. The magnets 502C and 502D may always present their north poles. In this configuration, the magnets may always attract each other in both positions of connector 102 relative to connector 104 as long as the opposite magnet pairs are placed in approximate physical alignment.

As shown in FIG. 9B, a connector system may instead be configured with the same poles of each set of magnets facing each other, such that the first connector 102 may always be repelled. In other words, the magnets 502A and 502B may present their south poles to the magnets 502C and 502D. The magnets 502C and 502D may also present their south poles, thus repelling the magnets 502A and 502B and thereby associated first connector 102. This may be desirable, for example, if there are two possible connector surfaces 604 on the external device 602. The connectors may be configured so that each is only attracted to a corresponding mate, and repelled by the other candidate.

FIGS. 9C and 9D show yet another possible configuration where magnetic poles within each set of magnets on a connector are aligned in opposite directions. As shown, one of magnets 502A and 502B may be present a north pole while the other magnet presents a south pole. The magnets 502C and 502D may similarly present the opposing poles such that the magnets attract when the second connector 104 is in the proper orientation and repel when the second connector 104 is not in the proper orientation relative to first connector 102. In this embodiment, the first connector 102 may therefore only connect in one orientation or position of the two orientations or positions in which the opposing magnet pairs are aligned. All of these configurations provide tactile feedback to the user attempting to connect the connectors together.

FIG. 10 is a block diagram of an illustrative connector 800 having one or more electromagnetic components. Additional feedback and functionality may be possible by using one or more electromagnets for the various magnets (502A-D) already described. In the example depicted in FIG. 10, the external device, such as device 602, may include electromagnets 802A and 802B controlled by an electromagnet controller 804. In an embodiment, the first magnet i.e. magnet 502A, is an electromagnet configured to be selectively activated by the electromagnet controller 804. The electromagnet controller 804 may be configured to alternatingly activate and either deactivate or reverse activate the electromagnets 802A-802B or 502A, thereby producing vibration of the first connector 102.

Using electromagnets (802A-802B) may allow the an external device 602 to selectively enable or disable the magnetic attraction of its connector surface or surfaces 604, as well as possibly reversing polarity of any given electromagnet. In some examples, the electromagnet controller 804 may be configured to eject the first connector 102 by reversing polarity or by turning the electromagnets off. In other embodiments, the connector surfaces 604 (or 616) may be selectively enabled, disabled, and/or configured with a certain polarity combination. The electromagnet controller 804 may also cause electromagnets 802A and/or 802B to vibrate or buzz based on certain predetermined conditions. In other embodiments, the electromagnets 802A, 802B, and/or electromagnet controller 804 may be disposed in the first connector 102, or in both connectors. In some embodiments, one or more magnetic components on a connector may be electromagnets. Further, in an embodiment, the magnets 502A-502B of the first connector may act as electromagnets and may be controlled by the electromagnet controller 804.

FIG. 11 shows an illustrative first connector 102 and an illustrative mechanical connector 900. FIG. 11 shows that the first connector 102 in the form shown similar to connector 500 and having an alignment element 218 in the form of an elongate ridge with spaced-apart magnets 208 and 212, such as magnets 502A and 502B, requires significantly less physical insertion to connect with a complementary connector 104 or 600 than mechanical connector 900, which would require insertion into a complementary receptacle having aligned conductors to establish a conductive signal and/or power path.

The following paragraphs may provide further information regarding illustrative versions of the above-described systems and methods related to EHF communications devices.

In one example, a first connector comprises a housing defining a first connector face configured to be positioned in at least one of a first position and a second position proximate to a second connector face of a second connector; a first extremely high frequency (EHF) communication unit disposed in the housing relative to the first connector face for communicating with a second EHF communication unit of the second connector when the first connector face is positioned in at least one of the first position and the second position relative to the second connector face; and a first magnet disposed in the housing relative to the first connector face, the first magnet configured to align with and repel a second magnet disposed relative to the second connector face when the first connector face is positioned in the second position relative to the second connector face, and the first magnet is configured not to align with and not to repel the second magnet when the first connector face is positioned in the first position relative to the second connector face.

The first connector may further comprise a first magnetic element disposed in the housing relative to the first connector face and spaced from the first magnet, wherein the first magnetic element is configured to align with and attract the second magnet when the first connector face is positioned in the first position relative to the second connector face. The first magnetic element may be at least one of a permanent magnet, an electromagnet, and a ferromagnetic element. The first magnetic element may be a third magnet, and the first magnet and the third magnet may have opposite magnetic polarities at the first connector face.

The first connector may further comprise a third EHF communication unit configured to communicate with a fourth EHF communication unit of the second connector when the first connector face is positioned in the at least one of the first position and the second position relative to the second connector face.

The first connector may further comprise a connector printed circuit board (PCB) supported in the housing; a first connector alignment element configured to mate with a complementary second connector alignment element of the second connector, wherein the first connector alignment element matingly receives the second connector alignment element when the first connector face is positioned in the first position and in the second position relative to the second connector face for providing physical alignment feedback to a user; a signal indication circuit having one or more light emitting diode (LED) indicators responsive to an electrical signal transmitted between the first and second EHF communications units; and a connector body disposed in the housing and configured to encapsulate the connector PCB and the first EHF communication unit.

The first EHF communication unit may be electrically and physically connected to a cable configured to receive at least one of power and one or more informational signals from an external source. The first magnet may have a magnet face that is aligned with the first connector face.

The first connector may further comprise an electromagnet controller, wherein the first magnet is an electromagnet configured to be selectively activated by the electromagnet controller, the electromagnet controller is configured to alternatingly activate and either deactivate or reverse activate the electromagnet thereby producing vibration of the first connector.

A connector system may comprise a first connector including a first housing defining a first connector face; a first extremely high frequency (EHF) communication unit disposed in the first housing relative to the first connector face; and a first magnet disposed in the first housing relative to the first connector face; and a second connector including a second housing defining a second connector face configured to be positioned in at least one of a first position and a second position proximate to the first connector face; a second EHF communication unit configured to communicate with the first EHF communication unit over a first channel when the first connector face is positioned in at least one of the first position and the second position relative to the second connector face; and a second magnet disposed in the second housing relative to the second connector face, the second magnet being configured not to align with and not to repel the second magnet when the first connector face is positioned in the first position relative to the second connector face, and the second magnet is configured to align with and repel the first magnet when the first connector face is positioned in the second position relative to the second connector face.

The second connector may comprise a fourth magnet disposed in the second housing relative to the second connector face. The fourth magnet may be configured to align with and to attract the first magnet when the first connector face is positioned in the first position relative to the second connector face; and align with and repel the third magnet when the first connector face is positioned in the second position relative to the second connector face.

The second connector comprises a second magnetic element disposed in the second housing relative to the second connector face, wherein the second magnetic element is configured to align with and be attracted to the first magnet when the first connector face is positioned in the first position relative to the second connector face. The first magnetic element and the second magnetic element comprise respective ferromagnetic elements.

The first connector may further comprise a third EHF communication unit disposed in the first housing relative to the first connector face, and the second connector may further comprise a fourth EHF communication unit disposed in the second housing relative to the second connector face. The third EHF communication unit may be configured to communicate with the fourth EHF communication unit when the first connector face is positioned in the at least one of the first position and the second position relative to the second connector face. In some examples, the first connector may further comprise a connector printed circuit board (PCB) supported in the first housing; a first connector alignment element configured to mate with a complementary second connector alignment element of the second connector, wherein the first connector alignment element matingly receives the second connector alignment element when the first connector face is positioned in at least one of the first position and the second position relative to the second connector face for providing physical alignment feedback to a user; a signal indication circuit having one or more light emitting diode (LED) indicators responsive to an electrical signal transmitted between the first and second EHF communications units; and a connector body disposed in the first housing and configured to encapsulate the connector PCB and the first EHF communication unit.

In some examples, a connector system may comprise a first connector including a first housing; a first EHF communication unit supported in the first housing; a third EHF communication unit supported in the second housing; and at least two first connector magnets supported in the first housing; and a second connector configured to couple with the first connector. The second connector may comprise a second housing defining a second connector face configured to be positioned in at least one of a first position and a second position proximate to the first connector face; a second EHF communication unit supported in the second housing and configured to communicate with the first EHF communication unit over a first channel; a fourth EHF communication unit supported in the second housing and configured to communicate with the third EHF communication unit on a second channel; and at least two second connector magnets supported in the second housing. Polarities of the at least two first connector magnets, and the at least two second connector magnets may be oriented such that the first connector couples with the second connector in a desired connector orientation and is held in a coupled state by attraction of the first magnet of the at least two first connector magnets to the first magnet of the at least two second connect magnets and attraction of the second magnet of the first connector magnets to the second magnet of the second connector magnets.

The first EHF communication unit may comprise at least one of an insulating material, a chip having an integrated circuit (IC), and an antenna capable of communicating with the IC, further wherein the antenna is fixed at a location by the insulating material.

In some examples, the first magnet of the at least two first connector magnets and the at least two second connector magnets may be electrically conductive, and in electrical contact when the first connector couples with the second connector in the desired connector orientation. The first magnet of the at least two first connector magnets and the at least two second connector magnets form a first path of electrical current in an electrical circuit in the first and second connectors. The second magnet of the at least two first connector magnets and second magnet of the at least two second connector magnets may be electrically conductive and in electrical contact when the first connector couples with the second connector in the desired connector orientation. The second magnet of the at least two first connector magnets and the second magnet of the at least two second connector magnets may form a second path of electrical current in the electrical circuit in the first connector and the second connector.

The at least two first connector magnets may be configured to provide a ground connection in the electrical circuit and may be configured to form in combination an electromagnetic shield around the first EHF communication unit and the third EHF communication unit. The first connector may be electrically and physically connected to a cable to obtain at least one of power and one or more informational signals from an external source. Each of the at least two first connector magnets may have a first pole of a first polarity and a second pole of a second polarity opposite of the first polarity, and the respective first poles of the at least two first connector magnets may be oriented in the same direction.

Each of the at least two second connector magnets has a first pole of a first polarity and a second pole of a second polarity opposite of the first polarity, and the respective first poles of the at least two second connector magnets are oriented in the same direction. The connector system may further comprise an electromagnet controller, wherein the first magnet is an electromagnet configured to be selectively activated by the electromagnet controller, the electromagnet controller is configured to alternatingly activate and either deactivate or reverse activate the electromagnet, thereby producing vibration of the first connector. In some examples, the first housing may have a first connector face that faces the second connector when the first connector couples with the second connector in the desired connector orientation, and each of the first magnet and second magnet may comprise a magnet face that is aligned with the first connector face.

It is believed that the disclosure set forth herein encompasses multiple distinct inventions with independent utility. While each of these inventions has been disclosed in its preferred form, the specific embodiments thereof as disclosed and illustrated herein are not to be considered in a limiting sense as numerous variations are possible. Each example defines an embodiment disclosed in the foregoing disclosure, but any one example does not necessarily encompass all features or combinations that may be eventually claimed. Where the description recites "a" or "a first" element or the equivalent thereof, such description includes one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

What is claimed is:

1. A connector comprising:
   a housing defining a first connector face configured to be positioned in at least one of a first position and a second position proximate to a second connector face of an additional connector;
   a first communication interface unit disposed within the housing relative to the first connector face of the connector to communicate with a second communication interface unit located in the additional connector using extremely high frequency (EHF) electromagnetic energy when the first connector face is positioned in at least one of the first position and the second position relative to the second connector face;
   a first alignment element disposed in the housing relative to the first connector face, the first alignment element configured to align with a second alignment element located in the additional connector; and
   an interface control circuit coupled to the first communication interface unit and configured to:
   detect whether the connector is aligned with the additional connector; and
   establish communication between the first and second communication interface units when the first connector face is positioned in the at least one of the first position and the second position relative to the second connector face.

2. The connector of claim 1, further comprising a first magnetic element configured generate a magnetic field to attract a second magnetic element included in the additional connector when the first connector face is positioned in at least one of the first position and the second position relative to the second connector face of the additional connector.

3. The connector of claim 1, further comprising a first magnetic element configured to generate a magnetic field to repel a second magnetic element when the first connector face is positioned in at least one of the first position and the second position relative to the second connector face of the additional connector.

4. The connector of claim 1, further comprising a first magnetic element configured to generate a magnetic field to attract a second magnetic element when the first connector face is positioned in the first position relative to the second connector face of the additional connector and repel the second magnetic element when the first connector face is positioned in the second position relative to the second connector face of the additional connector.

5. The connector of claim 1, further comprising a first magnetic element configured to generate a magnetic field to repel the second magnetic element when the first connector face is positioned in the first position relative to the second connector face of the additional connector and attract the second magnetic element when the first connector face is positioned in the second position relative to the second connector face of the additional connector.

6. The connector of claim 1, wherein the interface control unit is configured detect whether the connector is aligned with the additional connector based on an indication of a distance between the first and second interface control units.

7. The connector of claim 1, wherein the first communication interface unit is configured to generate an EHF transmission oriented orthogonally relative to an EHF transmission generated by the second communication interface unit.

8. The connector of claim 1, wherein the first magnetic element is at least one of a permanent magnet, a ferromagnetic element, and an electromagnet.

9. The connector of claim 1, wherein the second magnetic element is at least one of a permanent magnet, a ferromagnetic element, and an electromagnet.

10. The connector of claim 1, wherein the first magnetic element is comprised of at least two magnetic elements.

11. The connector of claim 1, wherein the second magnetic element is comprised of at least two magnetic elements.

* * * * *